US012560433B2

(12) United States Patent
Morton et al.

(10) Patent No.: US 12,560,433 B2
(45) Date of Patent: Feb. 24, 2026

(54) METHODS FOR LIFTING AND LOWERING MAGNETIC ANOMALIES FOR MAGNETIC NAVIGATION

(71) Applicant: Honeywell International Inc., Charlotte, NC (US)

(72) Inventors: Blaise Morton, Minnetonka, MN (US); Paul Samanant, Eden Prairie, MN (US); Trevor Keith Stephens, Maple Grove, MN (US); Robert Compton, Loretto, MN (US)

(73) Assignee: Honeywell International Inc., Charlotte, NC (US)

( * ) Notice: Subject to any disclaimer, the term of this patent is extended or adjusted under 35 U.S.C. 154(b) by 355 days.

(21) Appl. No.: 17/941,846

(22) Filed: Sep. 9, 2022

(65) Prior Publication Data

US 2024/0085182 A1     Mar. 14, 2024

(51) Int. Cl.
G01C 21/08 (2006.01)
G01C 21/00 (2006.01)
(Continued)

(52) U.S. Cl.
CPC ......... G01C 21/08 (2013.01); G01C 21/1654 (2020.08); G01C 21/3896 (2020.08); G01R 33/028 (2013.01)

(58) Field of Classification Search
CPC ............... G01C 21/08; G01C 21/1654; G01C 21/3896; G01C 21/165; G01R 33/028
(Continued)

(56) References Cited

U.S. PATENT DOCUMENTS 9,857,179 B2     1/2018   Larsen et al.
10,378,900 B2    8/2019   Gann et al.
(Continued)

FOREIGN PATENT DOCUMENTS

CN     107894235 B     2/2020
CN     111076717 A     4/2020
(Continued)

OTHER PUBLICATIONS

Pilkington, et al., "Potential field continuation between arbitrary surfaces—Comparing methods", Geophysics, May-Jun. 2017, vol. 82, No. 3, Pages Cover and J9 through J25 (Year: 2017).*
(Continued)

*Primary Examiner* — Tiffany P Young
*Assistant Examiner* — Ashleigh Nicole Turnbaugh
(74) *Attorney, Agent, or Firm* — Fogg & Powers LLC

(57)     ABSTRACT

A system and method for magnetic navigation are provided. The system comprises a navigation system for a vehicle, at least one processor operatively coupled with the navigation system, and a magnetic navigation module operatively coupled with the processor. The magnetic navigation module including instructions, executable by the processor, to perform a method comprising selecting latitude, longitude, and altitude ranges for the vehicle that is expected to travel in a region of interest; obtaining one or more magnetic anomaly maps for the region of interest; choosing a base Earth-centered, Earth-fixed (ECEF) plane and coordinates for the one or more magnetic anomaly maps; constructing an integration mesh on the base ECEF plane; and performing a Strakhov iteration process on the integration mesh to compute values of magnetic anomalies on a base source. The method then computes an estimated magnetic anomaly at a given point in space using alternative computation approaches.

10 Claims, 4 Drawing Sheets

Magnetic Anomaly Map Database Creation
300

Start with magnetic anomaly base source grid at nominal altitude

Lifting process reduces amount of valid data to a smaller region

Repeat lifting process to multiple altitudes and store the valid portions in a 3D array h = 12 km
h = 0 km

(51) Int. Cl.
　　*G01C 21/16*　　(2006.01)
　　*G01R 33/028*　(2006.01)
(58) Field of Classification Search
　　USPC ......................................................... 701/468
　　See application file for complete search history.

(56) References Cited

U.S. PATENT DOCUMENTS

| | | | | |
|---|---|---|---|---|
| 2016/0187142 A1* | 6/2016 | Larsen | ............... | G01P 15/14 |
| | | | | 701/500 |
| 2017/0074660 A1* | 3/2017 | Gann | ............... | B64D 43/00 |
| 2020/0379141 A1* | 12/2020 | Zhang | ............... | G01V 11/002 |
| 2021/0174139 A1* | 6/2021 | Ozog | ............... | G06V 20/56 |
| 2022/0026212 A1 | 1/2022 | Toutov et al. | | |

FOREIGN PATENT DOCUMENTS

| | | |
|---|---|---|
| CN | 112146655 A | 12/2020 |
| CN | 113776527 A | 12/2021 |

OTHER PUBLICATIONS

European Patent Office, "Extended European Search Report", from U.S. Appl. No. 17/941,846, filed Jan. 29, 2024, from Foreign Counterpart to U.S. Appl. No. 17/941,846, filed Jan. 29, 2024, pp. 1 through 7, Published: EP.

Canciani et al., Abstract of "Airborne Magnetic Anomaly Navigation", IEEE Transactions on Aerospace and Electronic Systems, vol. 53, Issue 1, Feb. 9, 2017, pp. 1 through 3.

Canciani et al., "An Analysis of the Benefits and Difficulties of Aerial Magnetic Vector Navigation", IEEE Transactions on Aerospace and Electronic Systems, vol. 56, No. 6, Dec. 2020, pp. 4161 through 4176.

Canciani, "Absolute Positioning Using the Earth's Magnetic Anomaly Field", Air Force Institute of Technology, Theses and Dissertations. 251, Sep. 15, 2016, https://scholar.afit.edu/etd/251, Pages Cover through 243.

Daniels et al., "Illinois, Indiana, and Ohio Magnetic and Gravity Maps and Data: A Website for Distribution of Data", Version1.0, Posted Mar. 2008, U.S. Geological Survey Data Series 321, as downloaded from https://pubs.usgs.gov/ds/321/.

Pilkington, et al., "Potential field continuation between arbitrary surfaces—Comparing methods", Geophysics, May Jun. 2017, vol. 82, No. 3, Pages Cover and J9 through J25, as downloaded Mar. 13, 17 from https://www.researchgate.net/publication/314973042.

Reid, "Aeromagnetic survey design", Geophysics, vol. 45, No. 5, May 1980, pp. 973 through 976.

Canciani, "Magnetic Navigation", Air Force Institute of Technology, ANT Center, Dec. 2018, downloaded from https://www.gps.gov/governance/advisory/meetings/2018-12/canciani.pdf, pp. 1 through 17, Published: US.

* cited by examiner

METHODS FOR LIFTING AND LOWERING MAGNETIC ANOMALIES FOR MAGNETIC NAVIGATION

BACKGROUND

In a Global Navigation Satellite System (GNSS)—denied environment, vehicle navigation systems need a position reference to counter the effects of inertial sensor bias and drift. One such position reference is magnetic navigation, which uses magnetic anomaly maps to get real-time updates for vehicle position in latitude-longitude-altitude (LLA) coordinates. In order to implement magnetic navigation, a vehicle navigation system employs magnetic sensors to measure the total magnitude of the magnetic field (background Earth magnetic field plus magnetic anomaly field), and compares that measurement with values computed from a model (for background Earth magnetic field) and a reference map of the magnetic anomaly field (anomaly map) measured at a known height above the surface of the Earth. An important step in this computation is the "lifting" of the magnetic anomaly field from the anomaly map at a given altitude to the altitude where the vehicle is currently located.

A standard technique used to lift magnetic anomalies is the fast-Fourier-transform (FFT) method, which can lift anomaly-map values to higher altitudes where an aircraft is estimated to be located in a computationally efficient manner. Unfortunately, the FFT method applied directly to magnetic anomaly maps is often inaccurate because the LLA coordinate system (in which the commercial anomaly maps are found) is not compatible with the theoretical assumptions that justify application of the FFT method. Errors are introduced by the FFT method when applied this way, and one common error is the introduction of a constant bias. Additionally, the FFT method is unstable when lowering the magnetic anomaly map to altitudes below the reference magnetic anomaly map's altitude.

Accordingly, there is a need for improved methods to lift and lower magnetic anomalies to provide for more accurate magnetic navigation.

SUMMARY

A system and method for magnetic navigation are provided. The system comprises a navigation system for a vehicle, at least one processor operatively coupled with the navigation system, and a magnetic navigation module operatively coupled with the at least one processor. The magnetic navigation module including instructions, executable by the at least one processor, to perform a method comprising selecting latitude, longitude, and altitude (LLA) ranges for the vehicle that is expected to travel in a region of interest; obtaining one or more magnetic anomaly maps for the region of interest; choosing a base Earth-centered, Earth-fixed (ECEF) plane and coordinates for the one or more magnetic anomaly maps; constructing an integration mesh on the base ECEF plane; and performing a Strakhov iteration process on the integration mesh to compute values of magnetic anomalies on a base source. The method then computes an estimated magnetic anomaly at a given point in space using alternative computation approaches. For example, the method can perform a Strakhov integration process for a given point in ECEF above the base ECEF plane to compute a lifted magnetic anomaly.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

Figure 1:
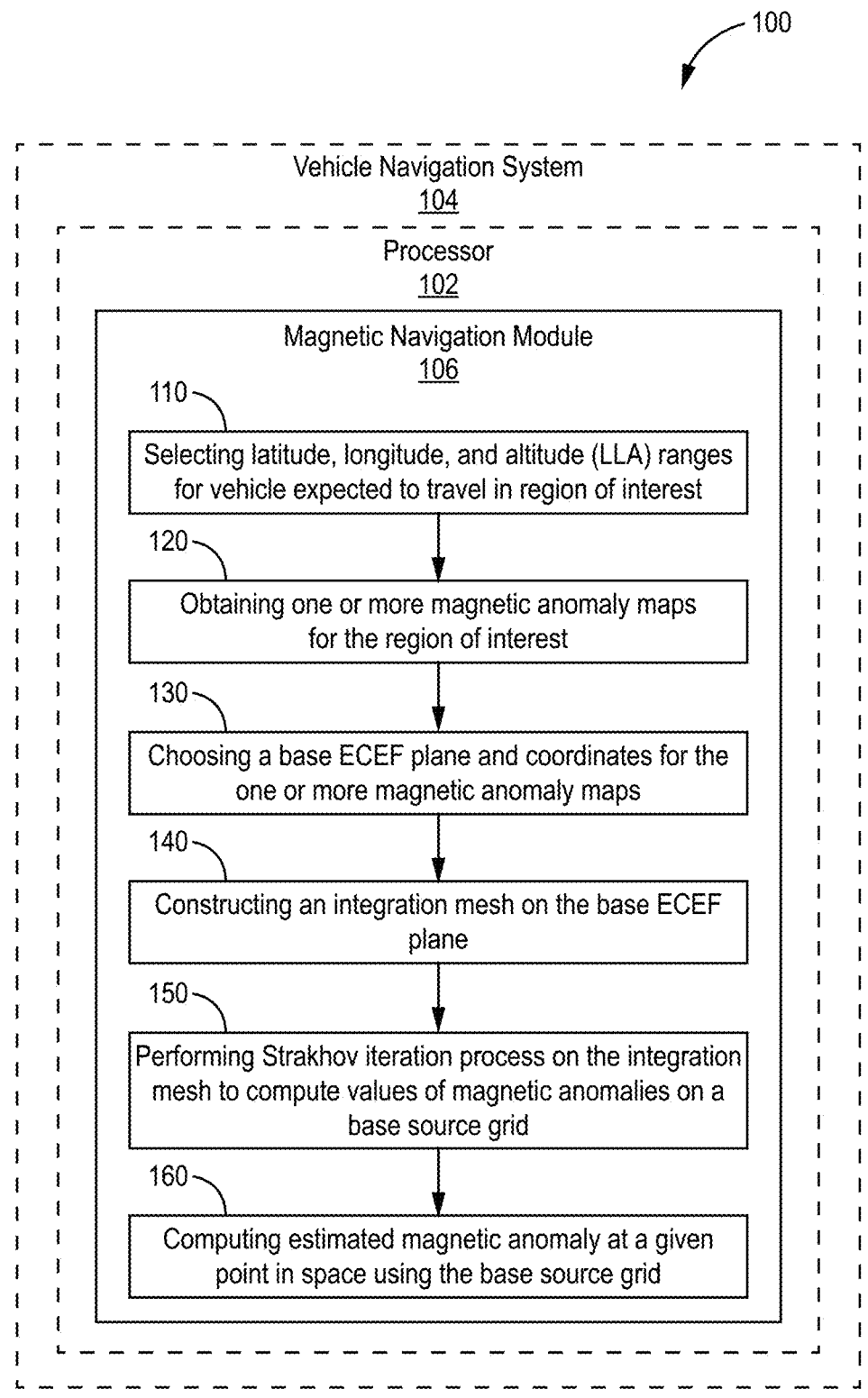
FIG. 1 is a block diagram of a system for magnetic navigation, according to one embodiment.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

The present approach provides an accurate and streamlined method for lifting and lowering magnetic anomalies for use in magnetic navigation.

In general, magnetic anomaly aided navigation techniques measure the Earth's magnetic strength in a given location and compares this with magnetic maps of the location to identify the position of a vehicle. The present approach overcomes the problems of prior techniques because the Earth-Centered Earth-Fixed (ECEF) coordinates used in the computations are compatible with the mathematical theory that justifies the computations of the lift. The present methods solve the "lifting" problem in a fast, accurate way to enable accurate magnetic navigation.

The benefits of the present methods include the ability to produce more accurate and reliable magnetic navigation systems, and also provide better performance for magnetic navigation systems at no increase in cost. There is no increase in cost because any magnetic navigation system needs to compute and store magnetic anomaly maps to be used in flight, and the present methods do not increase the cost of producing these anomaly maps.

Additionally, the present methods not only provide a better way for anomaly maps to be "lifted" to higher altitudes, but also allows the anomaly maps to be "lowered" to altitudes below the reference map. Other techniques such as the FFT method are not able to "lower" anomaly maps, and therefore the present approach opens up a wider application space for magnetic navigation.

The present approach can be applied for use in various aircraft, including manned aircraft such as an airplane or helicopter, an unmanned aircraft such as an unmanned aerial vehicle (UAV), an unmanned aircraft system (UAS) vehicle, an urban air mobility (UAM) vehicle, a drone, or the like.

The present approach uses the so-called "Strakhov" method of lifting magnetic and gravitational potential fields, which is described in Pilkington et al., *Potential Field Continuation Between Arbitrary Surfaces—Comparing Methods*, Geophysics, Vol. 82, No. 3, pp. J9-J25 (2017), the disclosure of which is incorporated by reference herein. Before the Strakhov method can be applied rigorously to the process of lifting magnetic anomaly fields, some justification is needed because magnetic anomalies are not harmonic functions (potential functions are assumed to be harmonic).

However, as the anomaly fields associated with Earth's magnetic field are typically very close to harmonic functions (within a few percent), the Strakhov method can be applied.

In one example, the present method can start with a commercially available, two-dimensional (2D) map of the magnetic anomaly field (e.g., a magnetic anomaly map provided by United States Geological Survey (USGS)). The method provides a more accurate lifting by using a two-step process that converts data from an initial 2D grid in latitude-longitude-altitude (LLA) coordinates to a 2D grid in ECEF coordinates. These two steps include: 1) from the 2D grid in LLA coordinates, determine a 2D mesh source on a flat ECEF plane (e.g., 200 km×200 km) located below the source (e.g., 3 km closer to the Earth's center); and 2) pick a parallel planar region and grid in ECEF above the 2D mesh source (e.g., 1 km farther from the Earth's center), and lift the 2D mesh source to produce a new 2D grid source in ECEF. Because the new 2D grid source is in ECEF, the FFT method can be used on that grid to produce an accurate three-dimensional (3D) grid in ECEF (e.g., 200 km×200 km×15 km) that can be interpolated to give an estimated anomaly at any point in the region. If more accuracy is needed, the new 2D grid source in ECEF can be lifted directly to an aircraft trajectory.

Additionally, the new 2D grid source in ECEF can be lifted to points below the original LLA 2D source map. This feature can allow use of a magnetic navigation system at altitudes below that of the original source map. In some implementations, the data will be computed values of a magnetic anomaly field (i.e. a map) at points in the 2D source grid and/or the 3D grid around an aircraft flightpath, and the data can reside in the navigation system of the aircraft.

Further details regarding the present approach described as follows and with reference to the drawings.

FIG. 1 illustrates a system 100 for magnetic navigation, according to one embodiment. The system 100 includes at least one processor 102 operatively coupled with a vehicle navigation system 104, and a magnetic navigation module 106 operatively coupled with processor 102. The magnetic navigation module 106 includes instructions, executable by processor 102, to perform a method that comprises selecting latitude, longitude, and altitude (LLA) ranges for a vehicle expected to travel in a region of interest (block 110), and obtaining one or more magnetic anomaly maps for the region of interest (block 120). The method then chooses a base Earth-centered, Earth-fixed (ECEF) plane and coordinates for the one or more magnetic anomaly maps (block 130), and constructs an integration mesh on the base ECEF plane (block 140). The method performs a Strakhov iteration process on the integration mesh to compute values of magnetic anomalies on a higher base source grid (block 150), now a planar grid in ECEF. The method then computes an estimated magnetic anomaly at a given point in space using the base source grid (block 160).

Figure 2:
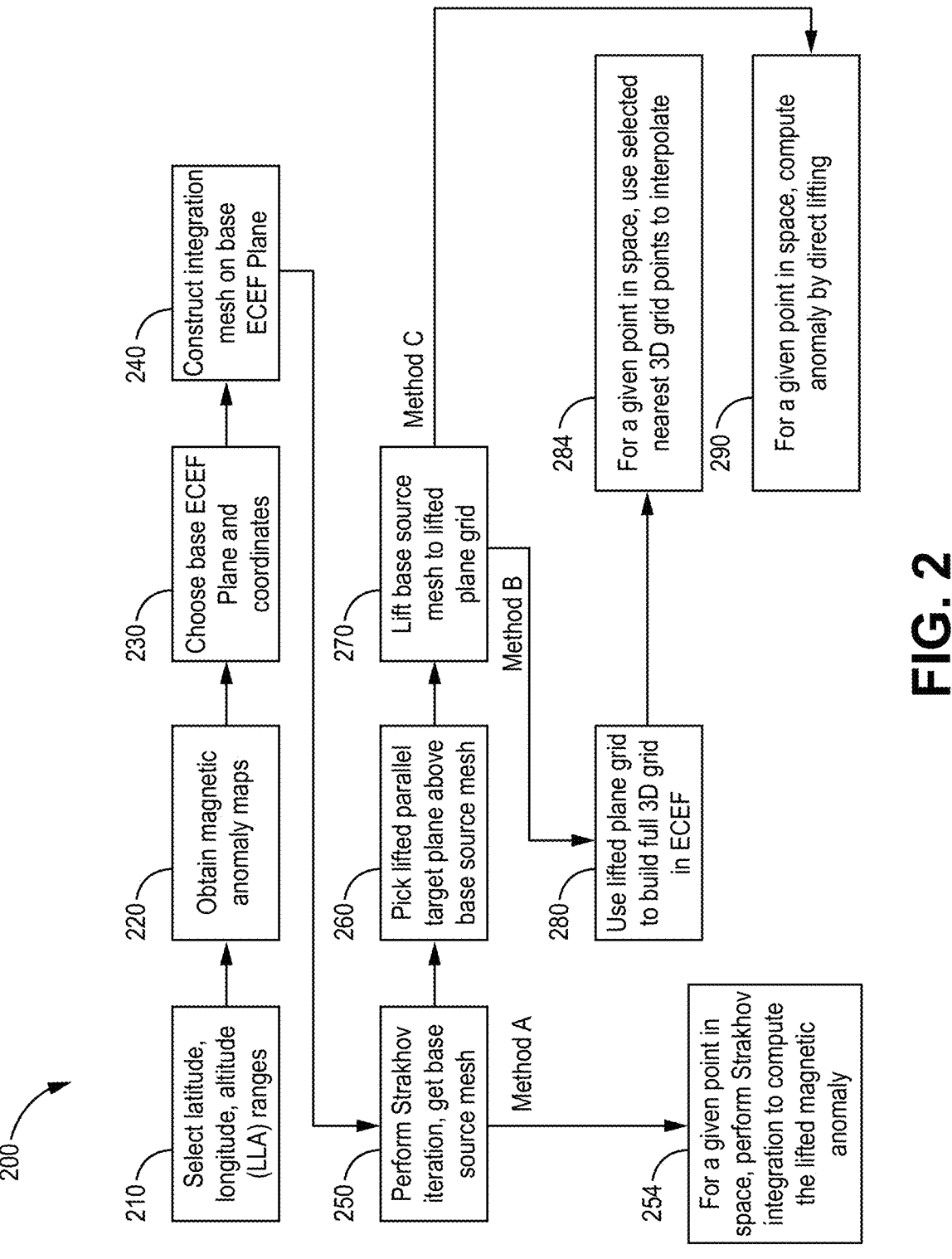
FIG. 2 is a flow diagram of a method for magnetic navigation, according to an example implementation.

FIG. 2 is a flow diagram of a method 200 for magnetic navigation, according to an example implementation. The method 200 comprises selecting latitude, longitude, and altitude (LLA) ranges for a vehicle expected to travel in a region of interest (block 210). For example, when planning a flight, each segment of the flight should take place inside a bounded range of latitude, longitude and altitude (above the Earth's surface). The method 200 also obtains magnetic anomaly maps for the region of interest (block 220). For example, magnetic anomaly maps are available (for some regions) from USGS. For practical reasons, more than one magnetic anomaly map would typically be required for a flight longer than 100 km. However, at any time during flight, only one map would be used, so the method described here serves as a valid part of the total algorithm used for navigation.

The method 200 then chooses a base ECEF plane and coordinates for each magnetic anomaly map (block 230). The ECEF plane is used because the coordinates are rectangular (unlike LLA), and coordinate transformations between ECEF and LLA are standard. The useful part of the base ECEF plane lies below the Earth's surface, with a maximum depth of about 3 km below the WGS-84 ellipsoid. The method 200 then constructs an integration mesh on the base ECEF plane (block 240). The magnetic anomaly maps are typically on a grid in latitude-longitude coordinates, with grid points separated by constant changes in angle (e.g., 0.01 degree). The method 200 computes the ECEF coordinates of the anomaly map grid points using standard transformation equations. The mesh on the base ECEF plane is found by projecting the anomaly map grid points to the base ECEF plane.

The method 200 then performs a Strakhov iteration process on the integration mesh to compute values of magnetic anomalies on a base source mesh (block 250). The values of the anomalies on the mesh points of the base source are computed by the Strakhov iterative methods as described in Pilkington et al. The Strakhov iteration process generally includes the following steps: 1) initially, assume the value of the base source at each ECEF mesh point is equal to the value of the magnetic anomaly at the reference map point that project onto it; 2) for each reference map point, compute the Strakhov integral of the base source and evaluate the error (difference between the field at the reference map point and the Strakhov integral); and 3) add the value of that error to the mesh point that the reference map point projects onto, update the base source in that way, and repeat steps 2 and 3 until the error reaches a threshold very close to 0.

The Strakhov iterative methods rely on the assumption that the potential field being lifted (or lowered) is harmonic. While this assumption does not directly apply to the magnetic anomalies used herein, the magnetic anomalies are approximately harmonic, and a bound for the size of the non-harmonic part of the field can be determined. To avoid large errors, care is needed when lowering the source anomaly grid to the mesh on the base ECEF plane. As such, interpolation of the field during computations is avoided. Another aspect of achieving accurate results is the number of iterations used to compute the lowering to the mesh on the ECEF base plane. For example, the difference of results after 100 iterations vs. 50,000 iterations for nine different sub-maps of an area was compared. In all cases the standard deviations of the errors were about 5-10 times larger for the case of 100 iterations vs. 50,000 iterations. For any source anomaly map, the method 200 computes the lowering only once (if the results are saved), and that computation can be done before flight, which eliminates the need for the Strakhov iteration to be operable in real-time.

After performing the Strakhov iteration process (at block 250), method 200 can compute an estimated magnetic anomaly at a given point in space using three alternative computation approaches. In a first computation approach (Method A), method 200 performs a Strakhov integration to compute a lifted magnetic anomaly (block 254). For example, method 200 can perform a Strakhov integration process for a given point in ECEF above the base ECEF plane to compute the lifted magnetic anomaly. The Strakhov integral is defined in equation (18) in Pilkington et al. (p. J13).

If the first computation approach is not used, then after performing the Strakhov iteration process (at block 250), method 200 performs additional steps prior to applying the other alternative computation approaches. In this case, method 200 chooses one or more lifted parallel target planes having one or more lifted plane grids that are above the base source mesh (block 260). For example, method 200 can pick an ECEF plane parallel to the base ECEF plane used above at block 240. This selected ECEF plane (e.g., 200 km×200 km) determines the lower bound for altitudes at which magnetic anomaly estimates are provided by the method for the map. The method 200 then lifts the base source mesh to the one or more lifted plane grids (block 270). For interpolation purposes, a rectangular grid is selected (e.g., points separated by 1 km in each axis direction), which is the lifted plane grid. The Strakhov integration process is used to lift the anomalies from the base source mesh to the lifted plane grid.

The method 200 can then compute an estimated magnetic anomaly at a given point in space using a second computation approach or a third computation approach.

In the second computation approach (Method B), after lifting the base source mesh to the lifted plane grid (at block 270), method 200 uses more than one lifted plane grid to build a full 3D grid in ECEF coordinates (block 280). For example, the method 200 selects additional parallel planes above the lifted parallel target plane and lifted plane grid, separated by constant distances (e.g., 1 km apart). The Strakhov integration process can be used to lift the grid to all these additional parallel planes, to make the 3D grid. Since the lifted parallel target plane is a grid, other methods can be used for this lifting (e.g. Fast Fourier Transform). Thereafter, for a given point in space, method 200 uses a selected number of nearest grid points in the 3D grid to compute the estimated magnetic anomaly via interpolation (block 284). For example, when in flight, method 200 can find the nearest eight points in the 3D grid and interpolate, which is a computationally efficient method for real-time operation.

In the third computation approach (Method C), after lifting the base source mesh to the lifted plane grid (at block 270), for the given point in space, method 200 computes the estimated magnetic anomaly by directly lifting the plane grid (block 290). The lifting may be done via the Strakhov integration process, or other techniques (e.g., Fast Fourier Transform) since the plane is a grid. For example, it is possible to lift directly from the lifted plane grid during flight, if that is desired.

Figure 3:
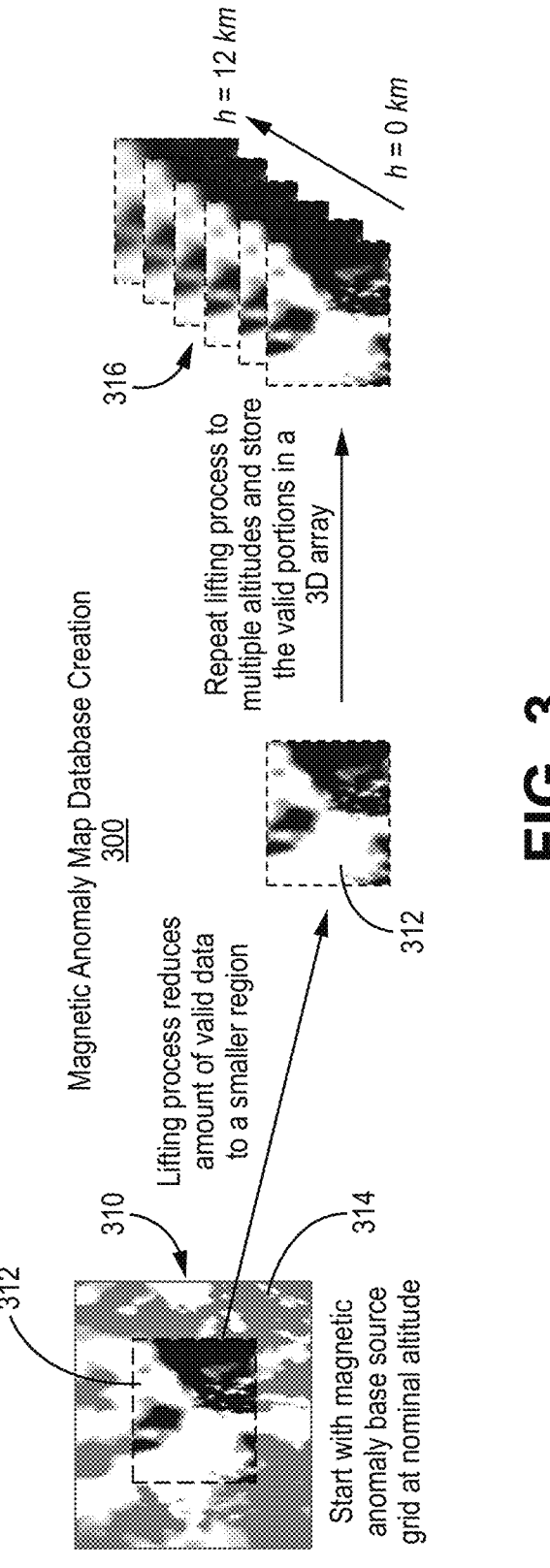
FIG. 3 is a diagrammatic representation of the creation of a magnetic anomaly map database, for use in magnetic navigation.

FIG. 3 depicts a diagrammatic representation of how the present methods can be used to produce a 3D magnetic anomaly map database. In particular, FIG. 3 shows an overview of a method 300 for magnetic anomaly map database creation. Initially, a magnetic anomaly map 310 at a nominal altitude is obtained. The dashed box within map 310 corresponds to a navigation region of interest (ROI) 312. The portion of map 310 outside of ROI 312 includes a padding region 314 for a lifting process. The method 300 performs the lifting process to reduce the amount of valid data to a smaller region corresponding to ROI 312, as padding region 314 is not considered to contain valid data after lifting. The method 300 repeats the lifting process to multiple altitudes, and stores the valid portions in a 3D array 316. For example, a height (h) of the valid portions in 3D array 316 can range from h=0 km to h=12 km.

Figure 4:
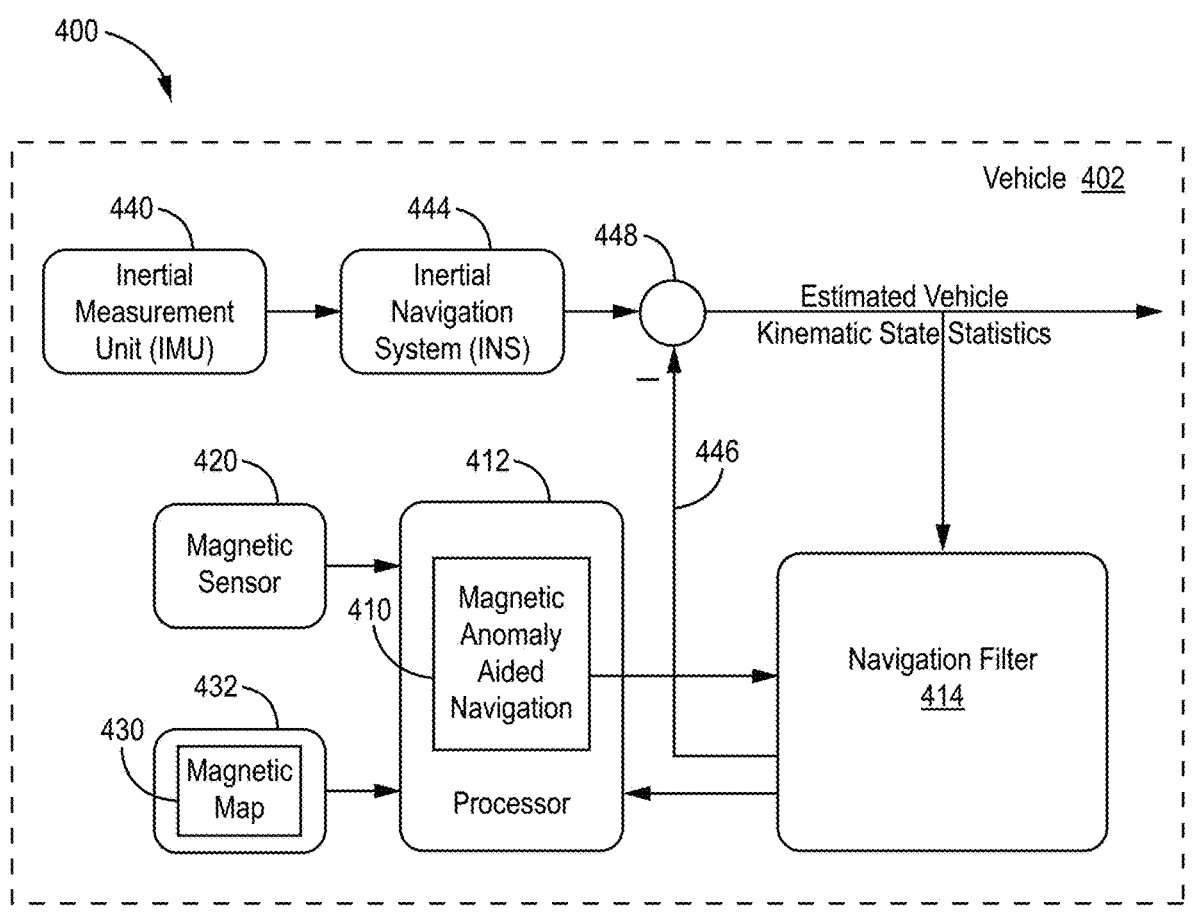
FIG. 4 is a block diagram of a system for magnetic aided navigation of a vehicle, according to an example embodiment.

FIG. 4 is a block diagram of a system 400 for magnetic aided navigation, according to one example embodiment. The system 400 is implemented in a vehicle 402, such as an aircraft, and includes a magnetic anomaly aided navigation module 410 that is hosted by an onboard processor 412, and a navigation filter 414 operatively coupled to magnetic anomaly aided navigation module 410. The magnetic anomaly aided navigation module 410 includes program instructions for one or more of the magnetic navigation algorithms described herein including computation of earth field. At least one magnetic sensor 420, such as a magnetometer, is onboard vehicle 402. The magnetic sensor 420 is operative to measures earth's magnetic strength over a given area over which vehicle 402 traverses. At least one magnetic map 430 is stored in a map database 432 onboard vehicle 402.

The magnetic anomaly aided navigation module 410 is operative to receive magnetic data for the given area from magnetic sensor 420 through processor 412. The magnetic anomaly aided navigation module 410 is also operative to receive map data from map database 432 through processor 412, with the map data corresponding to magnetic map 430 such as a magnetic anomaly map of the given area.

An onboard inertial measurement unit (IMU) 440 is operative to produce inertial measurements for vehicle 402 that are sent to an inertial navigation system (INS) 444, which operatively communicates with navigation filter 414. The INS 444 is configured to generate estimated vehicle kinematic state statistics (including position, velocity, and angular orientation) based on integration of the inertial measurements from IMU 440. The navigation filter 414 is configured to receive the estimated vehicle kinematic state statistics produced by INS 444.

The magnetic anomaly aided navigation module 410 is operative to generate statistics of the position of vehicle 402, based on a comparison of the magnetic data and the map data using the magnetic navigation algorithms described herein. The vehicle statistics include a mean and a variance that comprises real-time measurement errors of the position. The vehicle statistics generated by magnetic anomaly aided navigation module 410 are sent to navigation filter 414, which fuses the vehicle statistics with the state statistics from INS 444 to update the vehicle's position.

A correction signal 446 is sent from navigation filter 414 to an input of a subtractor 448, which is also configured to receive an output signal from INS 444. A differential between the signals from navigation filter 414 and INS 444 is output from subtractor 448 as updated estimated vehicle kinematic state statistics. These updated statistics are sent to other vehicle systems, and also fed back to navigation filter 414 for further processing.

The processing units and/or other computational devices used in systems and methods described herein may be implemented using software, firmware, hardware, or appropriate combinations thereof. The processing unit and/or other computational devices may be supplemented by, or incorporated in, specially designed application-specific integrated circuits (ASICs) or field programmable gate arrays (FPGAs). In some implementations, the processing unit and/or other computational devices may communicate through an additional transceiver with other computing devices outside of the system, such as those associated with a management system or computing devices associated with other subsystems controlled by the management system. The processing unit and/or other computational devices can also include or function with software programs, firmware, or other computer readable instructions for carrying out various process tasks, calculations, and control functions used in the methods and systems described herein.

The methods described herein may be implemented by computer executable instructions, such as program modules or components, which are executed by at least one processor or processing unit. Generally, program modules include routines, programs, objects, data components, data structures, algorithms, and the like, which perform particular tasks or implement particular abstract data types.

Instructions for carrying out the various process tasks, calculations, and generation of other data used in the operation of the methods described herein can be implemented in software, firmware, or other computer readable instructions. These instructions are typically stored on appropriate computer program products that include computer readable media used for storage of computer readable instructions or data structures. Such a computer readable medium may be available media that can be accessed by a general purpose or special purpose computer or processor, or any programmable logic device.

Suitable computer readable storage media may include, for example, non-volatile memory devices including semiconductor memory devices such as Random Access Memory (RAM), Read Only Memory (ROM), Electrically Erasable Programmable ROM (EEPROM), or flash memory devices; magnetic disks such as internal hard disks or removable disks; optical storage devices such as compact discs (CDs), digital versatile discs (DVDs), Blu-ray discs; or any other media that can be used to carry or store desired program code in the form of computer executable instructions or data structures.

Example Embodiments

Example 1 includes a system for magnetic navigation, the system comprising: a navigation system for a vehicle; at least one processor operatively coupled with the navigation system; a magnetic navigation module operatively coupled with the at least one processor, the magnetic navigation module including instructions, executable by the at least one processor, to perform a method comprising: selecting latitude, longitude, and altitude (LLA) ranges for the vehicle that is expected to travel in a region of interest; obtaining one or more magnetic anomaly maps for the region of interest; choosing a base Earth-centered, Earth-fixed (ECEF) plane and coordinates for the one or more magnetic anomaly maps; constructing an integration mesh on the base ECEF plane; performing a Strakhov iteration process on the integration mesh to compute values of magnetic anomalies on a base source; and performing a Strakhov integration process for a given point in ECEF above the base ECEF plane to compute a lifted magnetic anomaly.

Example 2 includes the system of Example 1, wherein the navigation system includes a navigation filter operatively coupled with the magnetic navigation module.

Example 3 includes the system of Example 2, further comprising: at least one magnetic sensor onboard the vehicle, the magnetic sensor operative to measure earth magnetic strength and generate magnetic data for the region of interest; and one or more magnetic anomaly maps stored in a map database onboard the vehicle.

Example 4 includes the system of Example 3, wherein the magnetic navigation module is operative to: receive the magnetic data for the region of interest from the at least one magnetic sensor, and receive map data from the map database, the map data corresponding to a magnetic anomaly map of the region of interest.

Example 5 includes the system of Example 4, wherein the magnetic navigation module is operative to generate statistics of position of the vehicle, based on a comparison of the magnetic data and the map data.

Example 6 includes the system of any of Examples 2-5, further comprising: an inertial measurement unit (IMU) onboard the vehicle, the IMU operative to produce inertial measurements for the vehicle; and an inertial navigation system (INS) in operative communication with the navigation filter and the IMU, the INS configured to generate estimated vehicle kinematic state statistics based on the inertial measurements from the IMU.

Example 7 includes the system of Example 6, wherein the navigation filter is configured to receive the estimated vehicle kinematic state statistics from the INS, and the statistics of position of the vehicle from the magnetic navigation module.

Example 8 includes the system of Example 7, wherein the navigation filter is operative to fuse the statistics of position and of the vehicle from the magnetic navigation module with the estimated vehicle kinematic state statistics from the INS, to update a position of the vehicle.

Example 9 includes the system of any of Examples 1-8, wherein the vehicle comprises a manned aircraft.

Example 10 includes the system of any of Examples 1-9, wherein the vehicle comprises an unmanned aircraft.

Example 11 includes a method for magnetic navigation, the method comprising: selecting latitude, longitude, and altitude (LLA) ranges for a vehicle that is expected to travel in a region of interest; obtaining one or more magnetic anomaly maps for the region of interest; choosing a base Earth-centered, Earth-fixed (ECEF) plane and coordinates for the one or more magnetic anomaly maps; constructing an integration mesh on the base ECEF plane; performing a Strakhov iteration process on the integration mesh to compute values of magnetic anomalies on a base source mesh; and computing an estimated magnetic anomaly at a given point in space using the base source mesh by a process comprising: choosing one or more lifted parallel target planes having one or more lifted plane grids that are above the base source mesh; lifting the base source mesh to the one or more lifted plane grids; using more than one parallel plane grids to build a three-dimensional (3D) grid in ECEF coordinates; and for the given point in space, using a selected number of nearest grid points in the 3D grid to compute the estimated magnetic anomaly via interpolation.

Example 12 includes the method of Example 11, further comprising comparing the estimated magnetic anomaly with a measured magnetic strength of the region of interest to identify a position of the vehicle.

Example 13 includes the method of any of Examples 11-12, wherein the vehicle includes: at least one magnetic sensor operative to measure earth magnetic strength and generate magnetic data for the region of interest; and a map database that stores the one or more magnetic anomaly maps.

Example 14 includes the method of Example 13, wherein the vehicle includes a magnetic navigation module that is operative to: receive the magnetic data for the region of interest from the at least one magnetic sensor, and receive map data from the map database, the map data corresponding to a magnetic anomaly map of the region of interest; wherein the magnetic navigation module is operative to generate statistics of position of the vehicle, based on a comparison of the magnetic data and the map data.

Example 15 includes the method of any of Examples 11-14, wherein the vehicle comprises an airplane, a helicopter, an unmanned aerial vehicle (UAV), an unmanned aircraft system (UAS) vehicle, an urban air mobility (UAM) vehicle, or a drone.

Example 16 includes a method for magnetic navigation, the method comprising: selecting latitude, longitude, and altitude (LLA) ranges for a vehicle that is expected to travel in a region of interest; obtaining one or more magnetic anomaly maps for the region of interest; choosing a base Earth-centered, Earth-fixed (ECEF) plane and coordinates for the one or more magnetic anomaly maps; constructing an integration mesh on the base ECEF plane; performing a Strakhov iteration process on the integration mesh to compute values of magnetic anomalies on a base source mesh; and computing an estimated magnetic anomaly at a given point in space using the base source mesh by a process comprising: choosing a lifted parallel target plane having a lifted plane grid that is above the base source mesh; lifting the base source mesh to the lifted plane grid; and for the given point in space, computing the estimated magnetic anomaly by direct lifting.

Example 17 includes the method of Example 16, further comprising comparing the estimated magnetic anomaly with a measured magnetic strength of the region of interest to identify a position of the vehicle.

Example 18 includes the method of any of Examples 16-17, wherein the vehicle includes: at least one magnetic sensor operative to measure earth magnetic strength and generate magnetic data for the region of interest; and a map database that stores the one or more magnetic anomaly maps.

Example 19 includes the method of Example 18, wherein the vehicle includes a magnetic navigation module that is operative to: receive the magnetic data for the region of interest from the at least one magnetic sensor, and receive map data from the map database, the map data corresponding to a magnetic anomaly map of the region of interest; wherein the magnetic navigation module is operative to generate statistics of position of the vehicle, based on a comparison of the magnetic data and the map data.

Example 20 includes the method of any of Examples 16-19, wherein the vehicle comprises an airplane, a helicopter, an unmanned aerial vehicle (UAV), an unmanned aircraft system (UAS) vehicle, an urban air mobility (UAM) vehicle, or a drone.

From the foregoing, it will be appreciated that, although specific embodiments have been described herein for purposes of illustration, various modifications may be made without deviating from the scope of the disclosure. Thus, the described embodiments are to be considered in all respects only as illustrative and not restrictive. In addition, all changes that come within the meaning and range of equivalency of the claims are to be embraced within their scope.

What is claimed is:

1. A system for magnetic navigation, the system comprising:

a navigation system for a vehicle;

at least one processor operatively coupled with the navigation system; and a magnetic navigation module operatively coupled with the at least one processor;

wherein the navigation system includes a navigation filter operatively coupled with the magnetic navigation module;

wherein the magnetic navigation module includes instructions, executable by the at least one processor, to perform a method comprising:

selecting latitude, longitude, and altitude (LLA) ranges for the vehicle that is expected to travel in a region of interest;

obtaining a two-dimensional (2D) map in LLA coordinates of a magnetic anomaly field for the region of interest, the 2D map comprising a magnetic anomaly map for a first altitude above the region of interest;

choosing a base Earth-centered, Earth-fixed (ECEF) plane and LLA coordinates for the 2D map;

constructing an integration mesh on the base ECEF plane;

performing a Strakhov iteration process on the integration mesh to compute values of magnetic anomalies on a base source; and performing a Strakhov integration process for a given point in ECEF above the base ECEF plane to compute a lifted magnetic anomaly;

wherein the method further comprises converting data from the 2D map in LLA coordinates to a 2D grid source in ECEF coordinates by a process comprising:

from the 2D map in LLA coordinates, determining a 2D mesh source on a flat ECEF plane located below the base source;

choosing a parallel planar region and grid in ECEF that is above the 2D mesh source; and lifting the 2D mesh source to produce the 2D grid source in ECEF coordinates, such that the 2D grid source in ECEF coordinates is for a second altitude that is different than the first altitude;

wherein the magnetic navigation module is operative to generate position statistics of the vehicle and send the position statistics to the navigation filter, which fuses the position statistics with vehicle state statistics to update a position of the vehicle and to aid in controlling navigation of the vehicle.

2. The system of claim 1, further comprising:

at least one magnetic sensor onboard the vehicle, the magnetic sensor operative to measure earth magnetic strength and generate magnetic data for the region of interest; and one or more magnetic anomaly maps stored in a map database onboard the vehicle;

wherein the one or more magnetic anomaly maps comprise United States Geological Survey (USGS) magnetic anomaly maps.

3. The system of claim 2, wherein the magnetic navigation module is operative to:

receive the magnetic data for the region of interest from the at least one magnetic sensor; and receive map data from the map database, the map data corresponding to a magnetic anomaly map of the region of interest.

4. The system of claim 3, wherein the magnetic navigation module is operative to generate the position statistics of the vehicle, based on a comparison of the magnetic data and the map data.

5. The system of claim 3, further comprising:

an inertial measurement unit (IMU) onboard the vehicle, the IMU operative to produce inertial measurements for the vehicle; and an inertial navigation system (INS) in operative communication with the navigation filter and the IMU, the INS configured to generate estimated vehicle kinematic state statistics based on the inertial measurements from the IMU.

6. The system of claim 5, wherein the navigation filter is configured to receive the estimated vehicle kinematic state statistics from the INS.

7. The system of claim 1, wherein the method performed by the magnetic navigation module further comprises:

performing a fast-Fourier-transform (FFT) method on the 2D grid source in ECEF coordinates to produce a three-dimensional (3D) grid in ECEF coordinates.

8. The system of claim 1, wherein the vehicle is a manned aircraft.

9. The system of claim 1, wherein the vehicle is an unmanned aircraft.

10. The system of claim 1, wherein the vehicle comprises an airplane, a helicopter, an unmanned aerial vehicle (UAV), an unmanned aircraft system (UAS) vehicle, an urban air mobility (UAM) vehicle, or a drone.

\* \* \* \* \*